Dec. 10, 1968 D. SPICKENREUTHER 3,416,048
SEMI-CONDUCTOR CONSTRUCTION
Filed May 6, 1966
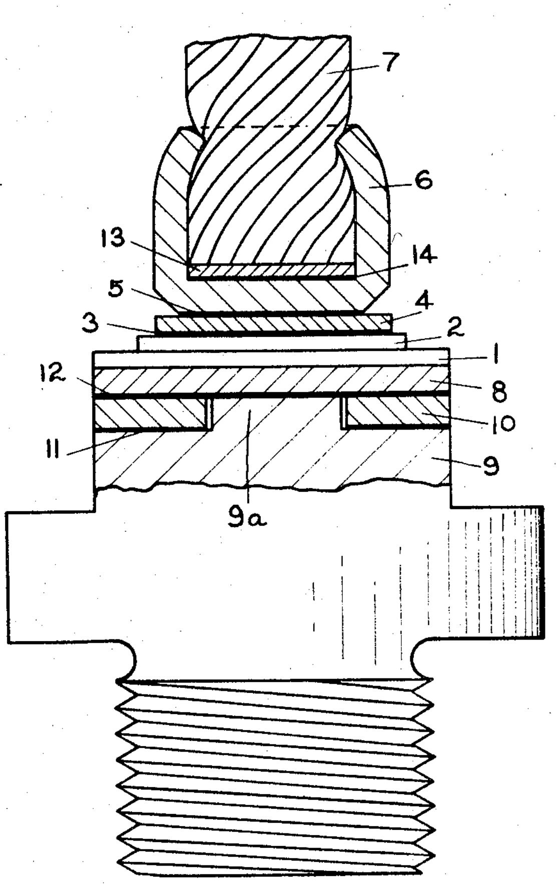
INVENTOR.
Dieter Spickenreuther
BY
Pierce, Scheffler & Parker
Attorneys 3,416,048
SEMI-CONDUCTOR CONSTRUCTION Dieter Spickenreuther, Baden, Aargau, Switzerland, assignor to Aktiengesellschaft Brown, Boveri & Cie., Baden, Switzerland, a joint-stock company Filed May 6, 1966, Ser. No. 548,221
Claims priority, application Switzerland, June 24, 1965, 8,897/65
2 Claims. (Cl. 317—234)

The present invention relates to structural assemblies for semi-conductor elements and more particularly to an improved arrangement for soldering together the various components which make up the assembly so as to minimize stress formations attributable to dissimilar expansion characteristics of the different materials which are utilized and which must be soldered together.

It is known that in a semi-conductor assembly the soft-soldered joint between the carrier plate of a semi-conductor element and a metal housing part is subjected to high mechanical stresses when there is a change in thermal loading. The reason resides in the differing coefficients of thermal expansion of the carrier plate and the housing part. The carrier plate is usually made of tungsten or molybdenum, since these metals have about the same coefficients of thermal expansion as the semi-conductor crystal, for example, silicon, joined to the carrier plate. On the contrary, the housing part is usually made of copper for reasons of high heat-conductivity.

There are known semi-conductor arrangements wherein the carrier plate is hard-soldered i.e. brazed to the housing part. A disadvantage in making such semi-conductor arrangements is above all the high melting point of the solder, at which it is difficult to avoid damaging the semi-conductor crystal. In a known process for making a semi-conductor arrangement, this disadvantage is circumvented by the fact that a support having about the same coefficient of thermal expansion as the carrier plate of the semi-conductor element is brazed to the housing part. In a further step of the process, the support is soft-soldered to the carrier plate. When there is a change in the thermal loading on the arrangement, the mechanical stresses occur in the layer of solder between the housing part and the support. Since the hard solder has good strength, the soldered joint also withstands changes in load satisfactorily. On the contrary, it is a disadvantage that the support, which like the carrier plate is made of molybdenum or tungsten, has lower heat-conductivity than copper, and accordingly impairs the thermal properties of the semi-conductor arrangement.

Finally, there is a known semi-conductor arrangement wherein the thermal expansion of the copper housing part is reduced by the fact that this part, which is of circular cross-section, is clamped by a ring having a lower coefficient of thermal expansion than the housing part, and being made, for example, of tungsten. The housing part then has about the same coefficient of expansion as the ring, so that the carrier plate of the semi-conductor element may be soft-soldered to the housing part. A disadvantage of this arrangement is the danger that the heavy mechanical stresses which occur in the housing part may cause the latter to become plastically deformed, with resultant damage to the layer of soft solder.

The present invention relates to a semi-conductor arrangement wherein the semi-conductor element comprising a disc-shaped carrier plate is soldered over a large area to a plane metal housing part having a different coefficient of expansion from the carrier plate, and wherein the housing part has hard-soldered to it a support having about the same coefficient of expansion as the carrier plate. The arrangement is characterized in that the support is an annular disc let into the housing part and hard-soldered on one face to the latter, the external diameter of the said disc being approximately equal to the diameter of the carrier plate, and its other face, which is disposed in the same plane as the surface of the housing part situated towards the carrier plate, being soft-soldered to the carrier plate together with the surface of the housing part.

The invention will be more precisely explained with reference to the drawing, in which a semi-conductor arrangement is shown by way of example, with the exception of the parts which close the housing.

1 designates a substantially monocrystalline silicon disc which has been endowed and contacted by alloying in a gold-antimony foil 2 in the desired manner in order to produce a p-n transition. The gold contact 2 is joined by a layer 3 of soft solder to the molybdenum disc 4, to which in turn a copper socket 6, closed at one end, is hard-soldered by means of the layer 5 of solder. A molybdenum disc 13, which prevents the base of the socket from bending, is hard-soldered to the inside base of the socket 6 by a layer 14 of solder. A current lead-in in the form of the stranded copper wire 7 is pressed into the socket 6.

The underside of the circular semi-conductor crystal 1 is provided with a circular carrier plate 8 made of molybdenum. The cylindrically shaped housing base 9, which can be screwed into a heat-sink, serves for current-lead-out and heat-dissipation purposes. At the top of the housing base 9 there is a central portion 9_a_ of reduced diameter into which is let the annular disc 10, likewise made of molybdenum and which is of the same diameter as the carrier plate 8. One face of the disc 10 is hard-soldered to the housing base 9, as indicated by the layer 11 of hard solder. The opposite face of the disc 10 and the surface of the housing base 9 situated towards the carrier plate 8 are disposed in the same plane. Both the face of the disc 10 and the surface of the central part 9_a_ of the housing base are joined to the carrier plate by the soft solder 12. The remaining parts of the assembly which are provided in known manner for the purpose of closing the housing in a gas-tight manner as not shown.

In the arrangement described, that region of the housing part in which expansion is relatively small when there is a change in thermal loading, namely the region in the vicinity of the center, is directly joined to the semi-conductor element by a layer of soft solder. This gives good heat-transfer without any disadvantageous heavy mechanical stresses occurring in the layer of soft solder. The mechanical stresses are transmitted to the layer of hard solder between the disc 10 and the housing part in the regions of great thermal expansion, namely, at greater distances from the center so that there is no loading on the layer of soft solder at this point either. Since the support is of annular shape, there is only a small amount of heat-transfer seen via the whole joint surface between the semi-conductor element and the housing part.

Making an arrangement according to the invention involves the following process, for example:

A housing base of copper is provided with a central turned portion of reduced diameter 10.5 mm. in diameter and 1.1 mm. high. A molybdenum annular disc having an external diameter of 21 mm., an internal diameter of 11 mm., and a thickness of 1 mm., and plated with nickel and copper on both sides, is placed together with a foil made of 72% silver and 28% copper over the reduced diameter portion. The face of the annular disc is soldered to the housing base at 800° C. in an atmosphere of hydrogen. After cooling, the housing base is pressed out flat in a jig, so that the face of the disc and the surface of the reduced diameter portion are disposed in the same plane. Tempering is then carried out for about two hours at 350° C. under protective gas in order to remove the internal stresses set up in pressing, and cooling takes place at about 2.5° C. per minute.

The molybdenum carrier plate of the semi-conductor element, which is joined to an alloyed silicon crystal and has, for example, a diameter of 20 mm. with a thickness of 0.75 mm., is thereupon soldered to the surface of the reduced diameter portion of the base and to the upper face of the annular disc. The solder used for this purpose is a foil of 80% gold and 20% tin. Soldering is carried out under protective gas at about 300° C.

Placing the alloyed silicon crystal in contact with a flexible stranded wire and closing the housing are carried out in known manner.

I claim:

1. In a semi-conductor arrangement, a cylindrical support base, said base having a central part of reduced diameter at one end thereof, an annular disc having an internal diameter substantially the same as that of said reduced part of said support base and which is fitted upon said reduced part, the length of said reduced part and the thickness of said annular disc being the same so that their upper surfaces are co-planar, a hard solder layer joining the lower annular surface of said disc to the adjacent surface of said support base which surrounds said reduced part, a circular carrier plate of substantially the same diameter as the external diameter of said annular disc, a soft solder layer joining the upper co-planar surfaces of said reduced part of said base and of said annular disc to the under surface of said carrier plate, and a semiconductor disc supported upon the upper surface of said carrier plate, said carrier plate and annular discs being constituted from a material having substantially the same coefficient of expansion and which is different from the expansion coefficient of the material from which said support base is made.

2. A semi-conductor arrangement as defined in claim 1 wherein said carrier plate and annular disc are made from molybdenum and said support base is made from copper.

References Cited

UNITED STATES PATENTS 3,331,996 7/1967 Green.

JOHN W. HUCKERT, *Primary Examiner.*

J. D. CRAIG, *Assistant Examiner.*

U.S. Cl. X.R.

174—52, 94